United States Patent
Nam et al.

(10) Patent No.: US 9,208,886 B2
(45) Date of Patent: Dec. 8, 2015

(54) MEMORY SYSTEM AND DRIVING METHOD THEREOF

(71) Applicant: Samsung Electronics Co., Ltd., Suwon-Si, Gyeonggi-Do (KR)

(72) Inventors: Sang-Wan Nam, Hwaseong-si (KR); Kuihan Ko, Seoul (KR); Yang-Lo Ahn, Seoul (KR); Kitae Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 78 days.

(21) Appl. No.: 14/197,723

(22) Filed: Mar. 5, 2014

(65) Prior Publication Data

US 2014/0293693 A1 Oct. 2, 2014

(30) Foreign Application Priority Data

Mar. 29, 2013 (KR) ........................ 10-2013-0034532

(51) Int. Cl.
| | |
|---|---|
| G11C 16/04 | (2006.01) |
| G11C 16/10 | (2006.01) |
| G11C 16/08 | (2006.01) |
| G11C 16/34 | (2006.01) |
| G11C 7/04 | (2006.01) |

(52) U.S. Cl.
CPC ............ *G11C 16/10* (2013.01); *G11C 16/0483* (2013.01); *G11C 16/08* (2013.01); *G11C 16/3427* (2013.01); *G11C 7/04* (2013.01)

(58) Field of Classification Search
CPC .... G11C 16/10; G11C 16/08; G11C 16/0483; G11C 16/3427; G11C 7/04
USPC ............. 365/185.11, 185.05, 185.17, 185.18, 365/185.23, 189.09
See application file for complete search history.

(56) References Cited

U.S. PATENT DOCUMENTS

| | | | |
|---|---|---|---|
| 7,944,749 B2 | 5/2011 | Lee et al. | |
| 8,134,871 B2 | 3/2012 | Dutta et al. | |
| 8,325,520 B2 | 12/2012 | Aritome | |
| 8,374,032 B2 | 2/2013 | Namiki et al. | |
| 8,411,503 B2 | 4/2013 | Lee | |
| 8,427,878 B2 | 4/2013 | Shim et al. | |
| 8,520,440 B2 * | 8/2013 | Ahn et al. | ................. 365/185.2 |
| 8,730,738 B2 * | 5/2014 | Oh et al. | ................. 365/185.22 |
| 2007/0047305 A1 * | 3/2007 | Conley | .................... 365/185.05 |
| 2008/0151627 A1 | 6/2008 | Lee et al. | |
| 2010/0002519 A1 | 1/2010 | Kim | |
| 2011/0032757 A1 | 2/2011 | Dutta et al. | |
| 2011/0086282 A1 * | 4/2011 | Lerner et al. | ................. 429/429 |
| 2011/0199833 A1 | 8/2011 | Shim et al. | |
| 2011/0242892 A1 | 10/2011 | Namiki et al. | |
| 2011/0267895 A1 | 11/2011 | Lee | |
| 2012/0120725 A1 | 5/2012 | Ahn et al. | |
| 2012/0176838 A1 | 7/2012 | Aritome | |
| 2012/0182809 A1 | 7/2012 | Dutta et al. | |
| 2012/0257455 A1 | 10/2012 | Oh et al. | |
| 2014/0226403 A1 * | 8/2014 | Nam et al. | ............... 365/185.11 |

FOREIGN PATENT DOCUMENTS

KR 101188372 B1 10/2012

* cited by examiner

*Primary Examiner* — Gene Auduong
(74) *Attorney, Agent, or Firm* — Harness, Dickeu & Pierce, P.L.C.

(57) ABSTRACT

A driving method of a nonvolatile memory device includes receiving a program command and an address. The method includes changing a number of adjacent zones of a plurality of zones formed of unselected word lines according to a location of a selected word line corresponding to the received address. The method further includes applying different zone voltages to the number of adjacent zones and remaining zones. The nonvolatile memory device includes a plurality of strings formed to penetrate word lines stacked on a substrate in a plate shape.

10 Claims, 13 Drawing Sheets

MEMORY SYSTEM AND DRIVING METHOD THEREOF

CROSS-REFERENCE TO RELATED APPLICATIONS

A claim for priority under 35 U.S.C. §119 is made to Korean Patent Application No. 10-2013-0034532 filed Mar. 29, 2013, in the Korean Intellectual Property Office, the entire contents of which are hereby incorporated by reference.

BACKGROUND

Inventive concepts described herein relate to nonvolatile memory devices and/or driving methods thereof.

Semiconductor memory devices may be categorized as volatile semiconductor memory devices or nonvolatile semiconductor memory devices. The nonvolatile semiconductor memory devices may retain data stored therein even at power-off. Data stored in the nonvolatile semiconductor memory device may be permanent or reprogrammable, depending upon the fabrication technology used. The nonvolatile semiconductor memory devices may be used for user data, program, and microcode storage in a wide variety of applications in the computer, avionics, telecommunications, and consumer electronics industries.

SUMMARY

According to at least one example embodiment, a driving method of a nonvolatile memory device includes receiving a program command and an address. The method includes changing a number of adjacent zones of a plurality of zones formed of unselected word lines according to a location of a selected word line corresponding to the received address. The method further includes applying different zone voltages to the number of adjacent zones and remaining zones. The nonvolatile memory device includes a plurality of strings formed to penetrate word lines stacked on a substrate in a plate shape.

According to at least one example embodiment, the method includes applying a program voltage to the selected word line.

According to at least one example embodiment, the method includes determining whether to spread charges of a word line adjacent to the selected word line, wherein the determining occurs at a point of time when a voltage of the selected word line is switched from a pass voltage to the program voltage.

According to at least one example embodiment, the method includes determining whether to spread charges of a word line adjacent to the selected word line, the determining is based on a voltage level of the unselected word line.

According to at least one example embodiment, the changing a number of adjacent zones includes changing a number of adjacent zones in response to a discharge enable signal, the discharge enable signal indicating whether to perform a discharging of charges accumulated on the adjacent word line.

According to at least one example embodiment, the zone voltage applied to the adjacent zone is greater than the zone voltages applied to the remaining zones.

According to at least one example embodiment, the method includes generating a zone voltage for each of the plurality of zones.

According to at least one example embodiment, an adjacent zone is added if (i) spreading of charges of the adjacent word line is desired and (ii) a zone voltage corresponding to the added zone is not generated.

According to at least one example embodiment, an adjacent zone is added if (i) spreading of charges of the adjacent word line is desired, (ii) a zone voltage corresponding to the added zone is blocked from the added zone, and (iii) a zone voltage applied to an adjacent zone before the changing is applied to the added zone.

According to at least one example embodiment, the number of adjacent zones is changed based on adjacent zone information provided from an external device.

According to at least one example embodiment, a nonvolatile memory device includes a memory cell array including a plurality of memory blocks having a plurality of strings formed to penetrate word lines stacked on a substrate, the word lines having a plate shape. The nonvolatile memory device includes a row decoder configured to select one of the memory blocks, and drive a selected word line of the selected memory block with a selection voltage and a plurality of zones of the selected memory block with corresponding zone voltages, the plurality of zones including unselected word lines. The nonvolatile memory device includes a voltage generating circuit configured to generate the selection voltage and the zone voltages. The nonvolatile memory device includes an input/output circuit configured to temporarily store data to be written in the selected memory block during a program operation and to temporarily store data read from the selected memory block during a read operation. The nonvolatile memory device includes a control logic configured to control the row decoder, the voltage generating circuit, and the input/output circuit. According to at least one example embodiment, the control logic is configured to determine a number of zones from among the plurality of zones based on information regarding the spread of charges to an unselected word line, and the determined number of zones includes at least one zone that has the selected word line.

According to at least one example embodiment, the voltage generating circuit includes a selection voltage generator configured to generate the selection voltage, and a plurality of zone voltage generators configured to generate the zone voltages.

According to at least one example embodiment, the determined number of zones includes a default zone including the selected word line and having at least one unselected word line that is adjacent to the selected word line, and an added zone that is adjacent to the default zone.

According to at least one example embodiment, the zone voltage generator corresponding to the added zone is configured to be turned on or off based on the information.

According to at least one example embodiment, the nonvolatile memory device further includes a discharge path configured to discharge charges of the unselected word lines.

According to at least one example embodiment, a vertical nonvolatile memory device includes a memory cell array including a plurality of memory blocks, each of the memory blocks being divided into a plurality of zones including first and second zones, each of the zones being a grouping of adjacent word lines, the second zone being adjacent to the first zone. The vertical nonvolatile memory device includes a voltage generator configured to generate a selection voltage, a first zone voltage, and a second zone voltage. The vertical nonvolatile memory device includes a control logic configured to control a row decoder to apply, during a program operation, the selection voltage to a selected word line in the first zone, the first zone voltage to unselected word lines in the first zone, and the second zone voltage to unselected word lines in the second zone.

According to at least one example embodiment, the first zone voltage is greater than the second zone voltage.

According to at least one example embodiment, the plurality of zones includes a third zone that is adjacent to the second zone, the voltage generator is configured to generate a third zone voltage, and the control logic is configured to control the row decoder to apply the third zone voltage to the third zone during the program operation.

According to at least one example embodiment, the first, second, and third zone voltages are substantially the same.

According to at least one example embodiment, the control logic is configured to control an application timing of the first and second zone voltages based on a voltage level of an unselected word line adjacent to the selected word line.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION OF EXAMPLE EMBODIMENTS

Figure 1:
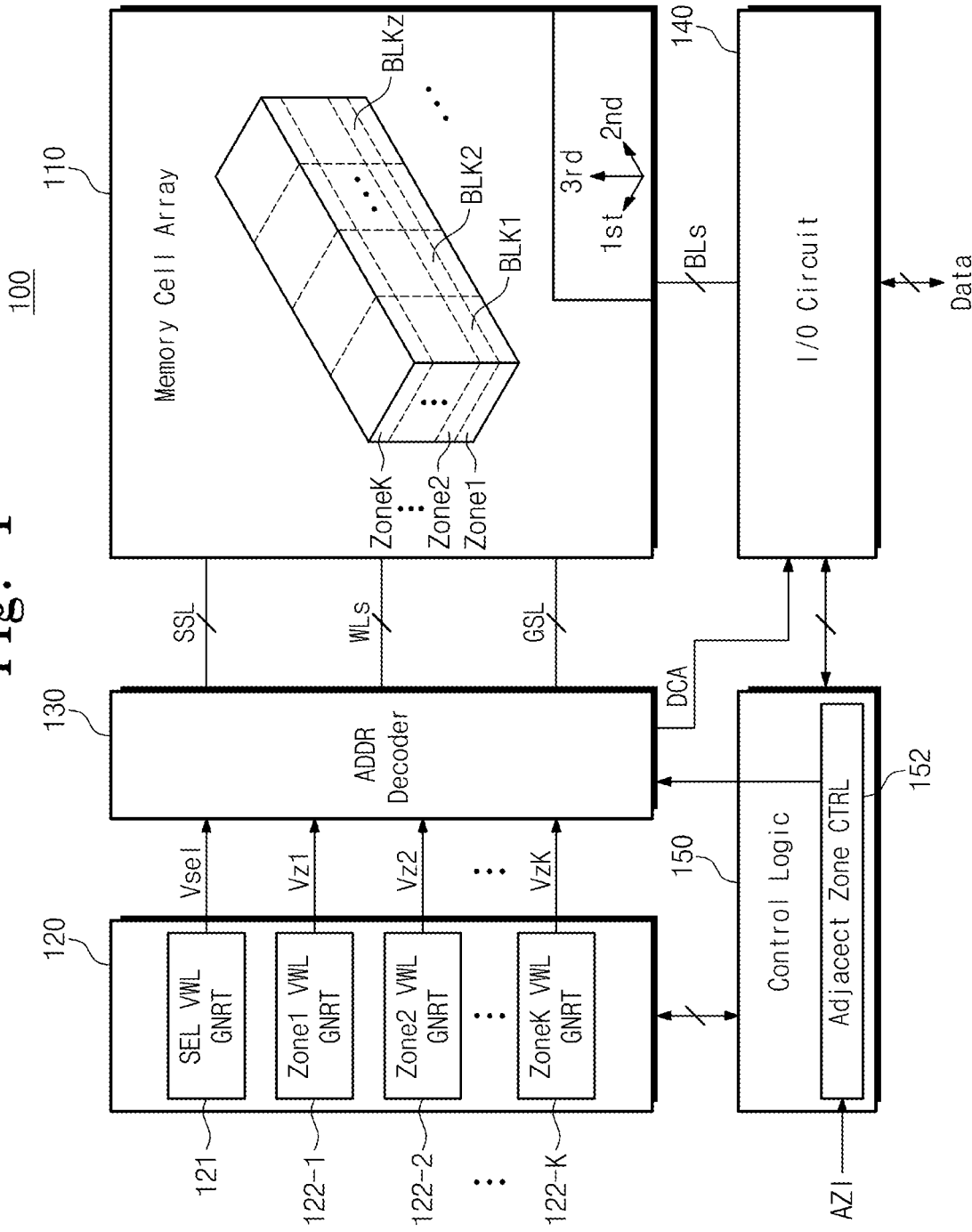
FIG. 1 is a block diagram schematically illustrating a nonvolatile memory device 100 according to at least one example embodiment of inventive concepts.

Example embodiments will be described in detail with reference to the accompanying drawings. Inventive concepts, however, may be embodied in various different forms, and should not be construed as being limited only to the illustrated example embodiments. Rather, these embodiments are provided as examples so that this disclosure will be thorough and complete, and will fully convey inventive concepts to those skilled in the art. Accordingly, known processes, elements, and techniques are not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and/or the specification and will not be interpreted in an idealized or overly formal sense unless expressly so defined herein.

A nonvolatile memory device according to at least one example embodiment of inventive concepts may reduce pass voltage distribution by spreading or discharging (or, removing) coupling charges of an unselected word line adjacent to a selected word line during a program operation. The nonvolatile memory device according to at least one example embodiment of inventive concepts may be configured to increase the number of adjacent zones of zones to spread the coupling charges or to activate a discharge path to discharge the coupling charges. Here, the zones may be defined by grouping unselected word lines. The number of word lines included in the zones may be different from or equal to one another. For example, zones may be variously implemented according to operation modes. Here, an adjacent zone may include at least one zone, corresponding to a location of a selected word line, from among a plurality of zones.

Below, a method of spreading coupling charges of an unselected word line is described.

FIG. 1 is a block diagram schematically illustrating a nonvolatile memory device 100 according to at least one example embodiment of inventive concepts. Referring to FIG. 1, a nonvolatile memory device 100 may include a memory cell array 110, a voltage generating circuit 120, an address decoder 130, an input/output circuit 140, and control logic 150.

The memory cell array 110 may be connected to the address decoder 130 through word lines WLs, at least one string selection line SSL, and at least one ground selection line GSL. The memory cell array 110 may be connected to the input/output circuit 140 through bit lines BLs. The memory cell array 110 may include a plurality of memory blocks BLK1 to BLKz (z being an integer of 2 or more).

Each of the memory blocks BLK1 to BLKz may include a plurality of strings which are arranged along a first direction, a second direction (being different from the first direction), and a third direction (e.g., a direction perpendicular to a plane formed in the first and second directions) to have a three-dimensional structure. Here, each string may include at least one string selection transistor, a plurality of memory cells, and at least one ground selection transistor stacked on a substrate. Each memory cell may store at least one data bit.

Also, the strings may be formed to penetrate plate-shaped word lines stacked on a substrate.

Zones Zone1 to ZoneK of each of the memory blocks BLK1 to BLKz may be defined by grouping word lines of a selected memory block. For example, the zones Zone1 to ZoneK may be defined by grouping unselected word lines during an operation (e.g., a program operation or read operation).

The voltage generating circuit 120 may generate a selection voltage Vsel, a plurality of zone voltages Vz1 to VzK (K being an integer of 2 or more), and an erase voltage Vers. The selection voltage Vsel may be a voltage applied to a selected word line at a program operation or a read operation, and may be one of a program voltage, a read voltage, and a verification voltage. The zone voltages Vz1 to VzK may be word line voltages (e.g., a pass voltage/read pass voltage) corresponding to the zones Zone1 to ZoneK, respectively.

During a program or read operation, unselected word lines included in each of the zones Zone1 to ZoneK may be electrically connected and supplied with a corresponding zone voltage.

The voltage generating circuit 120 may include a selection voltage generator 121, zone voltage generators 122-1 to 122-k, and an erase voltage generator (not shown). The selection voltage generator 121 may generate the selection voltage Vsel according to a control of the control logic 150.

Although not shown in FIG. 1, the selection voltage generator 121 may include a high voltage generator to generate a high voltage such as a program voltage, a low voltage generator to generate a low voltage such as a read voltage, and a negative voltage generator to generate a negative voltage.

The zone voltage generators 122-1 to 122-k may generate the zone voltages Vz1 to VzK according to a control of the control logic 150. During a program/read operation, the zone voltages Vz1 to VzK may be program pass voltages or read pass voltages corresponding to zones. The zone voltages Zone1 to ZoneK may have the same voltage level. Or, at least one of the zone voltages Zone1 to ZoneK may be different from the other thereof.

Although not shown in FIG. 1, the selection voltage generator 121 may include an erase voltage generator. The erase voltage generator may generate an erase voltage according to a control of the control logic 150. The erase voltage may be applied to a substrate of a memory block to be erased.

The address decoder 130 may be connected to the memory cell array 110 through the word lines, the at least one string selection line SSL and the at least one ground selection line GSL. The address decoder 130 may select the word lines, the string selection line SSL and the ground selection line GSL using a decoded row address. The address decoder 130 may decode a column address of an input address ADDR. The decoded column address DCA may be provided to the input/output circuit 140. In at least one exemplary embodiment, the address decoder 130 may include a row decoder, a column decoder, an address buffer, and so on.

During a program operation or read operation, the address decoder 130 may transfer the selection voltage Vsel to a selected word line and the zone voltages Vz1 to VzK to zones Zone1 to ZoneK of unselected word lines, respectively. During an erase operation, the address decoder 130 may transfer the zone voltages Vz1 to VzK to zones of a selected memory block.

The address decoder 130 may be configured to vary/adjust/change/control adjacent zones at a program, read or erase operation according to a control of the control logic 150. Herein, the adjacent zone may be a zone, physically closer to a selected word line, from among the zones Zone1 to ZoneK. That is, the address decoder 130 may vary the number of adjacent zones according to a selected word line corresponding to an input address.

For ease of description, an adjacent zone may be classified into a default adjacent zone or an added adjacent zone. Here, the default adjacent zone may be a zone including bit lines adjacent to a selected word line. Also, the added adjacent zone may be a zone added as desired. For example, the added adjacent zone may be a zone immediately adjacent to the default adjacent zone.

During an operation, the number of adjacent zones may increase as desired. For example, during a program operation, since it is desired to reduce a pass voltage disturbance caused by a pass voltage, the number of adjacent zones may increase to spread charges of unselected word lines adjacent to a selected word line.

The input/output circuit 140 may be connected to the memory cell array 110 through the bit lines. The input/output circuit 140 may be configured to receive the decoded column address DCA from the address decoder 130. The input/output circuit 140 may select the bit lines using the decoded column address DCA.

The input/output circuit 140 may receive data from an external device (e.g., a memory controller) to store it in the memory cell array 110. The input/output circuit 140 may read data from the memory cell array 110 and output the read data to the external device. Meanwhile, the input/output circuit 140 may read data from a first area of the memory cell array 110 and store the read data in a second area of the memory cell array 110. For example, the input/output circuit 140 may be configured to perform a copy-back operation.

The control logic 150 may control an overall operation of the nonvolatile memory device 100 including a program operation, a read operation, an erase operation, and so on. The control logic 150 may operate in response to control signals or command provided from the external device. The control logic 150 may include an adjacent zone controller 152 to vary the number of adjacent zones according to adjacent zone information AZI.

In at least one exemplary embodiment, the adjacent zone information AZI may be generated in the nonvolatile memory device 100. In at least one other exemplary embodiment, the adjacent zone information AZI may be provided from the external device. In at least one exemplary embodiment, the adjacent zone information AZI may be variable according to an operation mode (e.g., a read mode or a program mode) and/or according to timing information (e.g., a voltage level, a time, etc.) of operation modes.

The nonvolatile memory device 100 according to at least one example embodiment of inventive concepts may change the number of adjacent zones based on the adjacent zone information AZI. That is, the nonvolatile memory device 100 may change an electrical connection of unselected word lines. During a program operation, the nonvolatile memory device 100 may spread or reduce coupling charges by adding an adjacent zone as desired, so that pass voltage disturbance induced by memory cells connected to an unselected word line is reduced.

In particular, during a program setup operation, the nonvolatile memory device 100 may increase victim capacitance by adding an adjacent zone and electrically connecting unselected word lines in a default adjacent zone and the added adjacent zone. In this case, coupling charges of an adjacent zone and an adjacent word line corresponding to a selected word line may be spread. Throughout this description, an adjacent word line may refer to an unselected word line that is adjacent to a selected word line WLn (i.e., WLn−1). Thus, the nonvolatile memory device 100 may widen a pass voltage window by reducing pass voltage disturbance of an unselected word line during a program operation.

A manner of changing the number of adjacent zones may not be limited to a program operation. For example, it is possible to change the number of adjacent zones during a read operation as desired.

Figure 2:
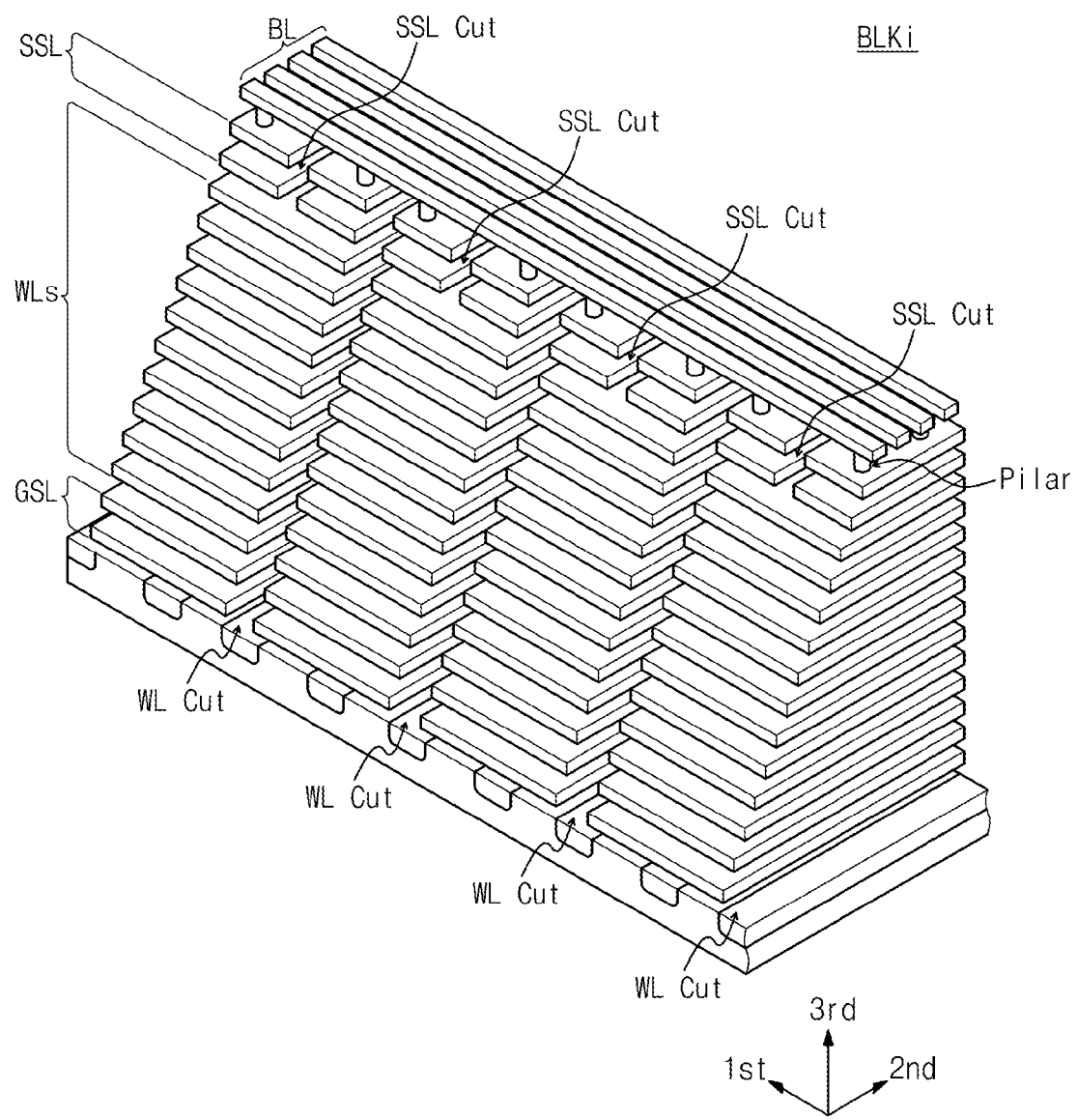
FIG. 2 is a perspective view of a memory block BLKi of FIG. 1, according to at least one example embodiment of inventive concepts.

FIG. 2 is a perspective view of a memory block BLKi of FIG. 1, according to at least one example embodiment of inventive concepts. Referring to FIG. 2, four sub blocks may be formed on a substrate. Each sub block may be formed by stacking at least one ground selection line GSL, a plurality of word lines WLs, and at least one string selection line SSL on the substrate between word line cuts WL cut in a plate shape. The string selection line SSL may be separated by string selection line cuts SSL cut. Although not shown in FIG. 2, each word line cut WL cut may include a common source line CSL. In at least one exemplary embodiment, the common source lines CSL included in the word line cuts may be interconnected. A string may be formed by making a pillar 113 connected to a bit line penetrate the at least one string selection line SSL, the word lines WLs, and the at least one ground selection line GSL.

In FIG. 2, a structure between word line cuts is a sub block. However, inventive concepts are not limited thereto. For example, a structure between a word line cut and a string selection line cut may be defined as a sub block.

The memory block BLKi according to at least one example embodiment of inventive concepts may be implemented to have a merged word line structure where two word lines are merged into one word line.

Figure 3:
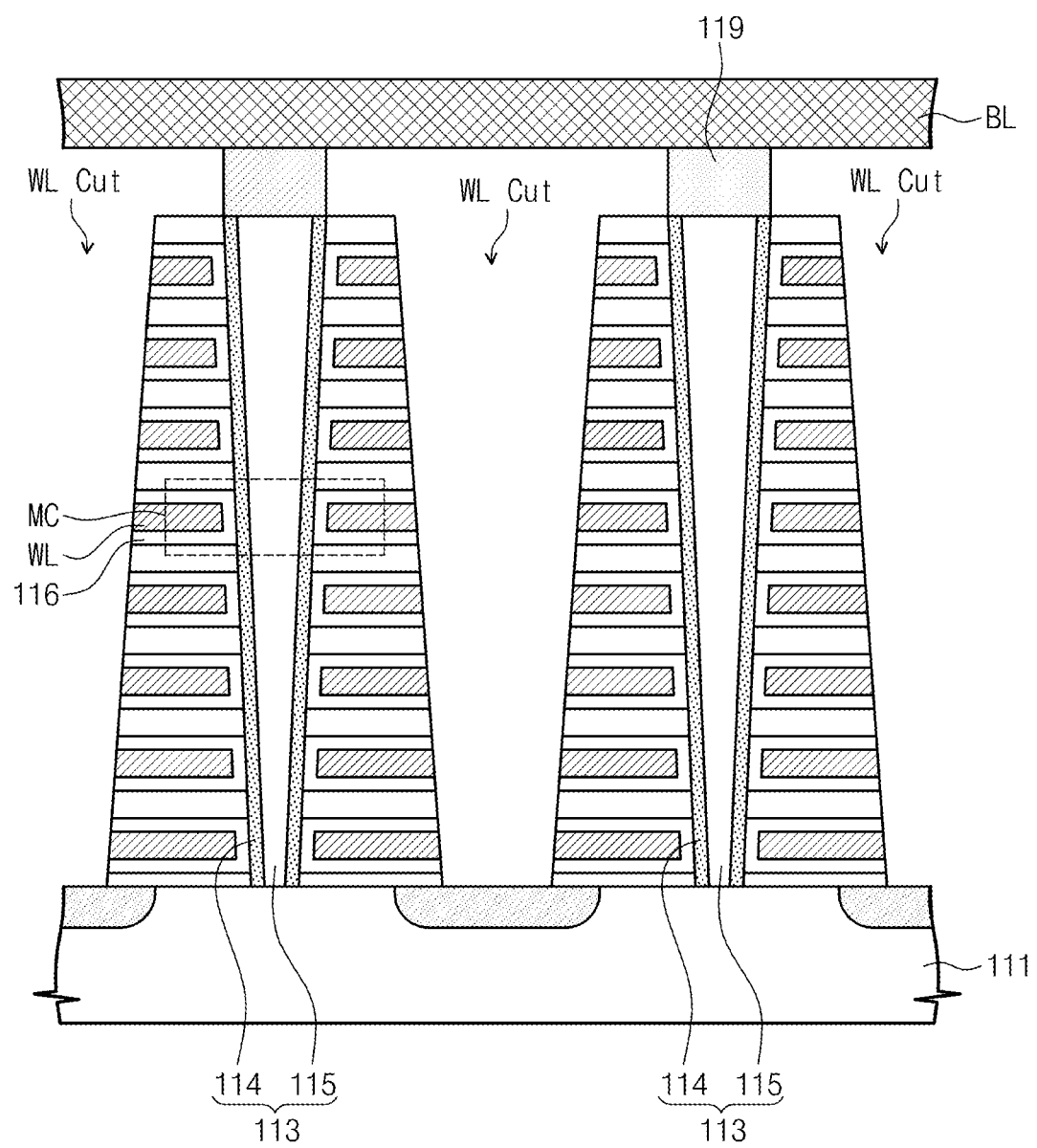
FIG. 3 is a cross-sectional view of a pillar according to at least one example embodiment of inventive concepts.

FIG. 3 is a cross-sectional view of a pillar according to at least one example embodiment of inventive concepts. Referring to FIG. 3, each pillar 113 may include a channel film 114 and an insulation material 115. The channel film 114 may be formed of a p-type silicon material. Each pillar 113 may be tapered toward a substrate 111. As illustrated in FIG. 3, each pillar 113 may be formed to penetrate word lines WLs, and may include the channel film 114, the insulation material 115, and an information storage layer 116.

As illustrated in FIG. 3, as each pillar 113 is tapered toward the substrate 111, electrical characteristics of memory cells MC may vary according to their structural locations. In at least one exemplary embodiment, the number of adjacent zones may be decided according to a structural location of a memory cell (or, a location of a word line corresponding to the memory cell). A nonvolatile memory device 100 according to at least one example embodiment of inventive concepts may adjust/control/vary/change the number of adjacent zones to according to an operation mode and a desired level of performance. That is, the number of adjacent zones may not be fixed.

Figure 4:
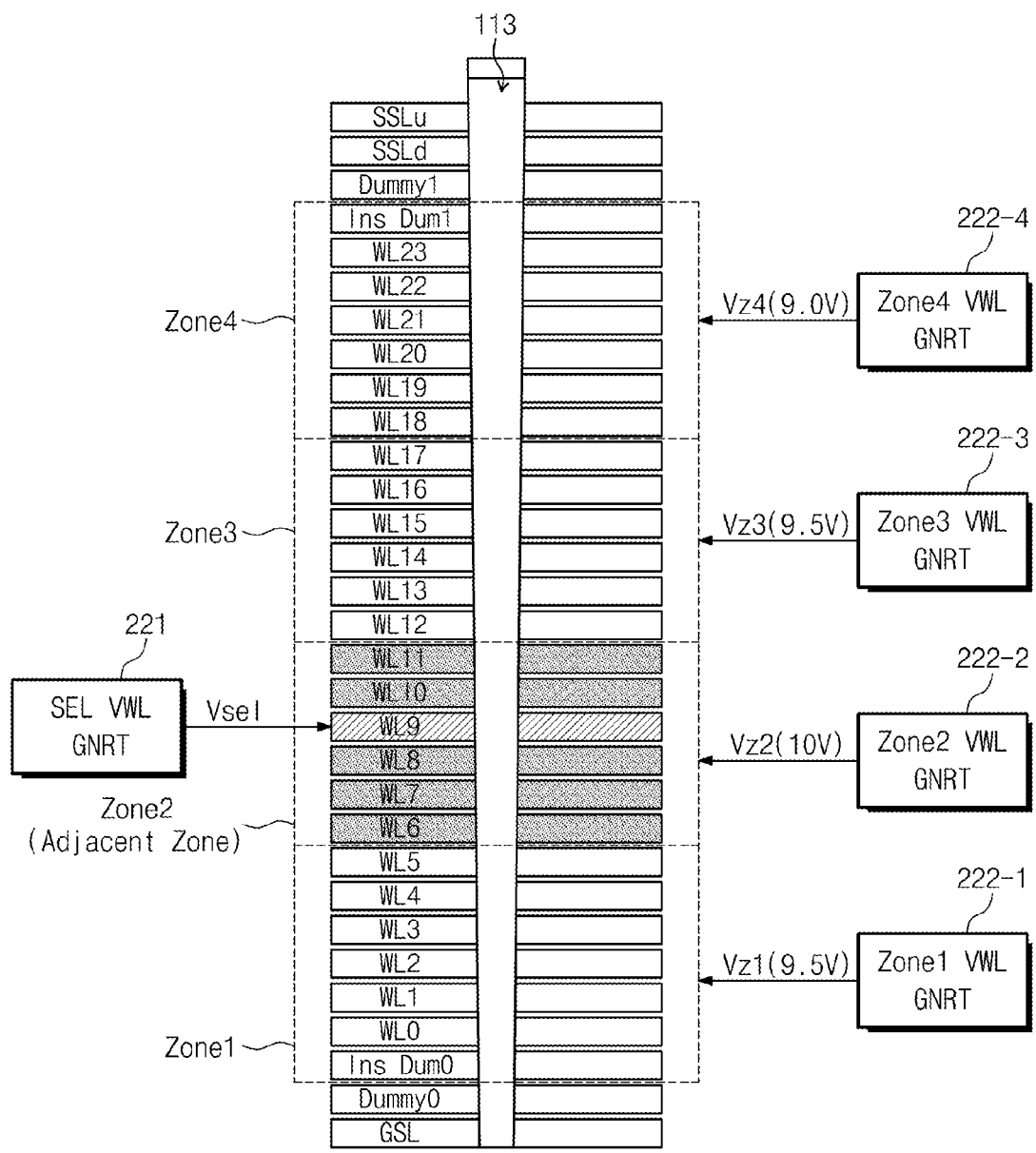
FIG. 4 is a diagram schematically illustrating a default adjacent zone of a nonvolatile memory device 100 of FIG. 1 at a program operation, according to at least one example embodiment of inventive concepts.

FIG. 4 is a diagram schematically illustrating a default adjacent zone of a nonvolatile memory device 100 of FIG. 1 at a program operation, according to at least one example embodiment of inventive concepts. In FIG. 4, it is assumed that a memory block includes 24 word lines and 24 word lines constitute four zones Zone1 to Zone4. However, inventive concepts are not limited thereto. Also, it is assumed that a word line WL9 is selected during a program operation and one default adjacent zone exists. Thus, the default adjacent zone may be a second zone Zone2.

Referring to FIG. 4, a selection voltage generator 221 may generate a selection voltage Vsel (or, a program voltage) having a level for a program operation. The selection voltage Vsel may be applied to the selected word line WL9.

A second zone voltage generator 222-2 may generate a second zone voltage Vz2 (e.g., 10V). The second zone voltage Vz2 may be applied to a default adjacent zone, that is, the second zone 2. As illustrated in FIG. 4, the second zone may be formed of five word lines WL6 to WL8, WL10 and WL11.

Zone voltages Vz1, Vz3, and Vz4 (e.g., 9.5V, 9.5V, and 9.0V) generated by zone voltage generators 222-1, 222-3, and 222-4 may be applied to corresponding zones Zone1, Zone3, and Zone4.

In at least one exemplary embodiment, each of the first and fourth zones Zone1 and Zone4 may include an insertion dummy word line Ins Dum0, Ins Dum1 as illustrated in FIG. 4.

In at least one exemplary embodiment, the second zone Vz2 (e.g., 10V) applied to the default adjacent zone Zone2 may be higher than the zone voltages Vz1 and Vz3 (e.g., 9.5V) applied to the zones Zone1 and Zone3 adjacent to the default adjacent zone Zone2 as illustrated in FIG. 4.

In at least one exemplary embodiment, the second zone Vz2 (e.g., 10V) applied to the default adjacent zone Zone2 may be higher than the zone voltage Vz4 (e.g., 9.0V) applied to the zone Zone4 as illustrated in FIG. 4.

In at least one exemplary embodiment, the zone voltages Vz1 and Vz3 (e.g., 9.5V) applied to the zones Zone1 and Zone3 adjacent to the default adjacent zone Zone2 may be higher than the zone voltage Vz4 (e.g., 9.0V) applied to the zone Zone4 as illustrated in FIG. 4.

It should be understood that the zone structure illustrated in FIG. 4 is exemplary and example embodiments are not limited thereto. For example, the zone structure may be changed at a read operation.

When one default adjacent zone exists, all zone voltage generators 222-1 to 222-4 may generate corresponding zone voltages Vz1 to Vz4.

A nonvolatile memory device 100 according to at least one example embodiment of inventive concepts may increase the number of adjacent zones as desired to reduce coupling capacitance at a program operation.

Figure 5:
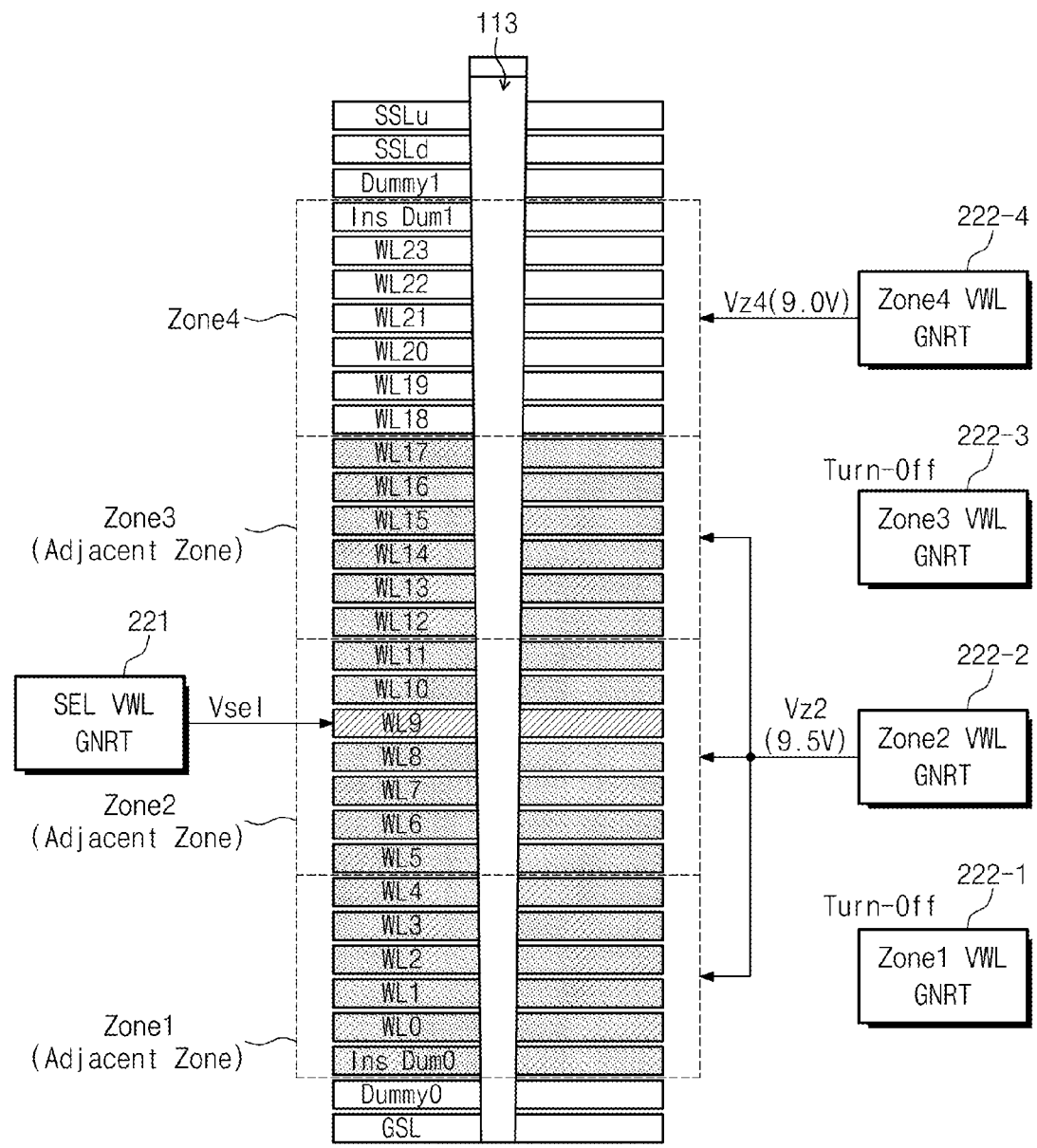
FIG. 5 is a diagram schematically illustrating an adjacent zone changed at a program operation of a nonvolatile memory device 100 of FIG. 1, according to at least one example embodiment of inventive concepts.

FIG. 5 is a diagram schematically illustrating an adjacent zone changed during a program operation of a nonvolatile memory device 100 of FIG. 1, according to at least one example embodiment of inventive concepts. Referring to FIG. 5, an adjacent zone changed may be formed of a default adjacent zone Zone2 and added adjacent zones Zone1 and Zone3 which are adjacent to the default adjacent zone Zone2. That is, the number of adjacent zones may be 3. Here, added adjacent zones Zone1 and Zone3 are connected to the default adjacent zone Zone2 and zone voltage generators 222-1 and 222-3 are turned off. That is, a second zone voltage Vz2 may be applied to word lines of the first zone Zone1, the second zone Zone2, and the third zone Zone3. Thus, coupling charges of an unselected word line may be spread. The remaining conditions may be the same as those of FIG. 4.

In FIG. 5, zone voltage generators 222-1 and 222-3 corresponding to the added adjacent zones Zone1 and Zone3 may be turned off. However, inventive concepts are not limited thereto. For example, the zone voltages Vz1 and Vz3 corresponding to the added adjacent zones Zone1 and Zone3 may be blocked, and the second zone voltage Vz2 corresponding to the default adjacent zone Zone2 may be applied to the added adjacent zones Zone1 and Zone3. At such, the zone voltage generators 222-1 and 222-3 corresponding to the added adjacent zones Zone1 and Zone3 are not turned off.

A nonvolatile memory device 100 according to at least one example embodiment of inventive concepts may reduce coupling capacitance caused by the selected word line WL9 by increasing the number of adjacent zones during a program operation as desired. Since the coupling capacitance is reduced, pass voltage disturbance may be reduced.

A method of spreading coupling charges of an unselected word line adjacent to a selected word line is described above with reference to FIGS. 1 to 5. Below, a method of discharging coupling charges of an unselected word line adjacent to a selected word line is described.

Figure 6:
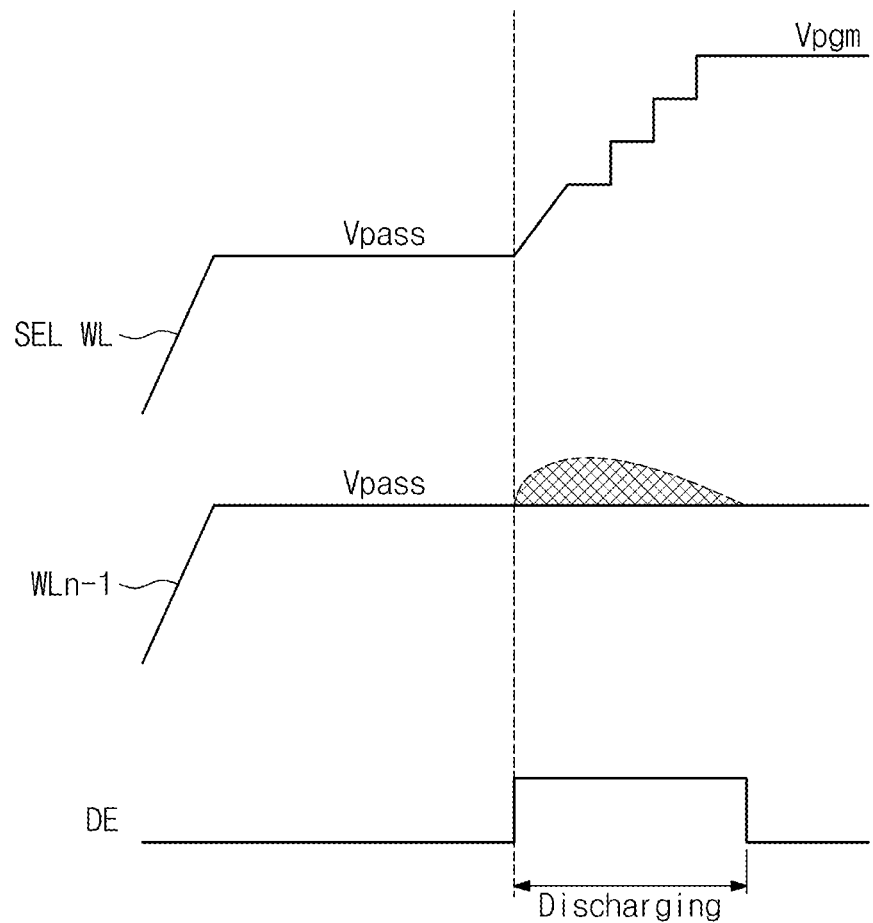
FIG. 6 is a diagram schematically illustrating a method of discharging charges of an adjacent word line at a program operation of a nonvolatile memory device, according to at least one example embodiment of inventive concepts.

FIG. 6 is a diagram schematically illustrating a method of discharging charges of an adjacent word line at a program operation of a nonvolatile memory device, according to at least one example embodiments of inventive concepts. Referring to FIG. 6, charges of an adjacent word line (e.g., WLn−1) may be discharged through a discharge path during a desired (or alternatively, predetermined) interval from a time when a program voltage Vpgm higher than a pass voltage Vpass is applied, that is, in response to a discharge enable signal DE. Here, each of zones Zone1 to ZoneK (refer to FIG. 1) may include a discharge path. A portion marked by a dotted line of FIG. 6 may show that a voltage of the adjacent word line WLn−1 is boosted by coupling charges induced by a selected word line SEL WL.

During a program operation, an increase in a voltage of an adjacent word line WLn−1 due to coupling charges may be reduced (or alternatively, prevented) by applying a program voltage and simultaneously discharging charges of the adjacent word line WLn−1 through a discharge path.

The discharge enable signal DE may be activated according to a program timing of FIG. 6, for example, according to a level of a program voltage Vpgm applied to the selected word line SEL WL. That is, a timing of the discharge enable signal DE may be determined in response to a program mode signal (e.g., a pass voltage applying signal, a program voltage applying signal). However, inventive concepts are not limited thereto. The discharge enable signal DE may be activated according to a voltage level of the adjacent word line WLn−1.

Figure 7:
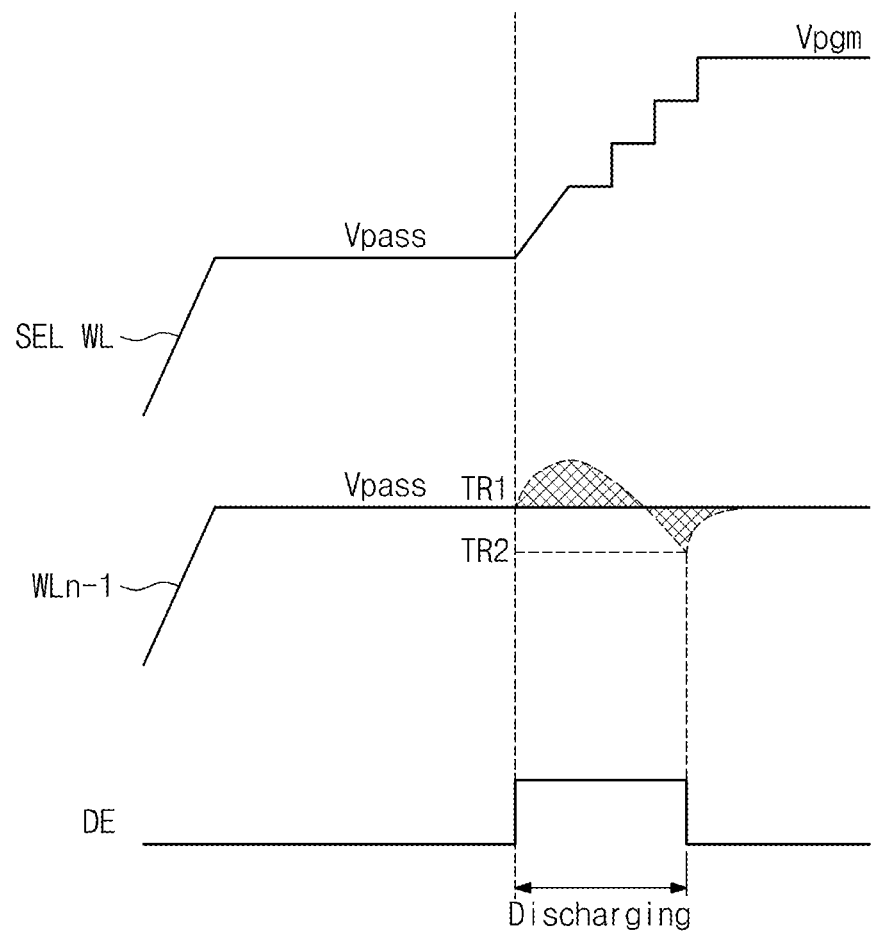
FIG. 7 is a diagram schematically illustrating a method of discharging charges of an adjacent word line at a program operation of a nonvolatile memory device, according to at least one example embodiment of inventive concepts.

FIG. 7 is a diagram schematically illustrating a method of discharging charges of an adjacent word line at a program operation of a nonvolatile memory device, according to at least one example embodiment of inventive concepts. Referring to FIG. 7, a discharge enable signal DE may be activated to discharge charges of an adjacent word line (e.g., WLn−1) when a voltage of an adjacent word line WLn−1 has a first level TR1 (e.g., Vpass). The discharge enable signal DE may be inactivated to recharge charges of an adjacent word line (e.g., WLn−1) when a voltage of the adjacent word line WLn−1 has a second level TR2. A portion marked by a dotted line may indicate a voltage level of the adjacent word line WLn−1 before discharging.

According to a program operation of inventive concepts, a voltage level of the adjacent word line WLn−1 may be stabilized by detecting a voltage level of the adjacent word line WLn−1 and recharging or discharging coupling charges according to the detection result.

Start and end points of a discharge operation for discharging charges of the adjacent word line WLn−1 of FIG. 7 are not be limited to the above description. For example, charges of the adjacent word line WLn−1 may be discharged or recharged in various methods according to a combination of the methods of FIGS. 6 and 7.

A technique of discharging coupling charges of the adjacent word line WLn−1 using a discharge path may be described with reference to FIGS. 6 and 7. A method of spreading coupling charges of the adjacent word line WLn−1 as described with reference to FIGS. 1 to 5 may be considered as a method of discharging coupling charges. A method of changing the number of adjacent zones as described with reference to FIGS. 1 to 5 may be applied to methods described with reference to FIGS. 6 and 7.

Figure 8:
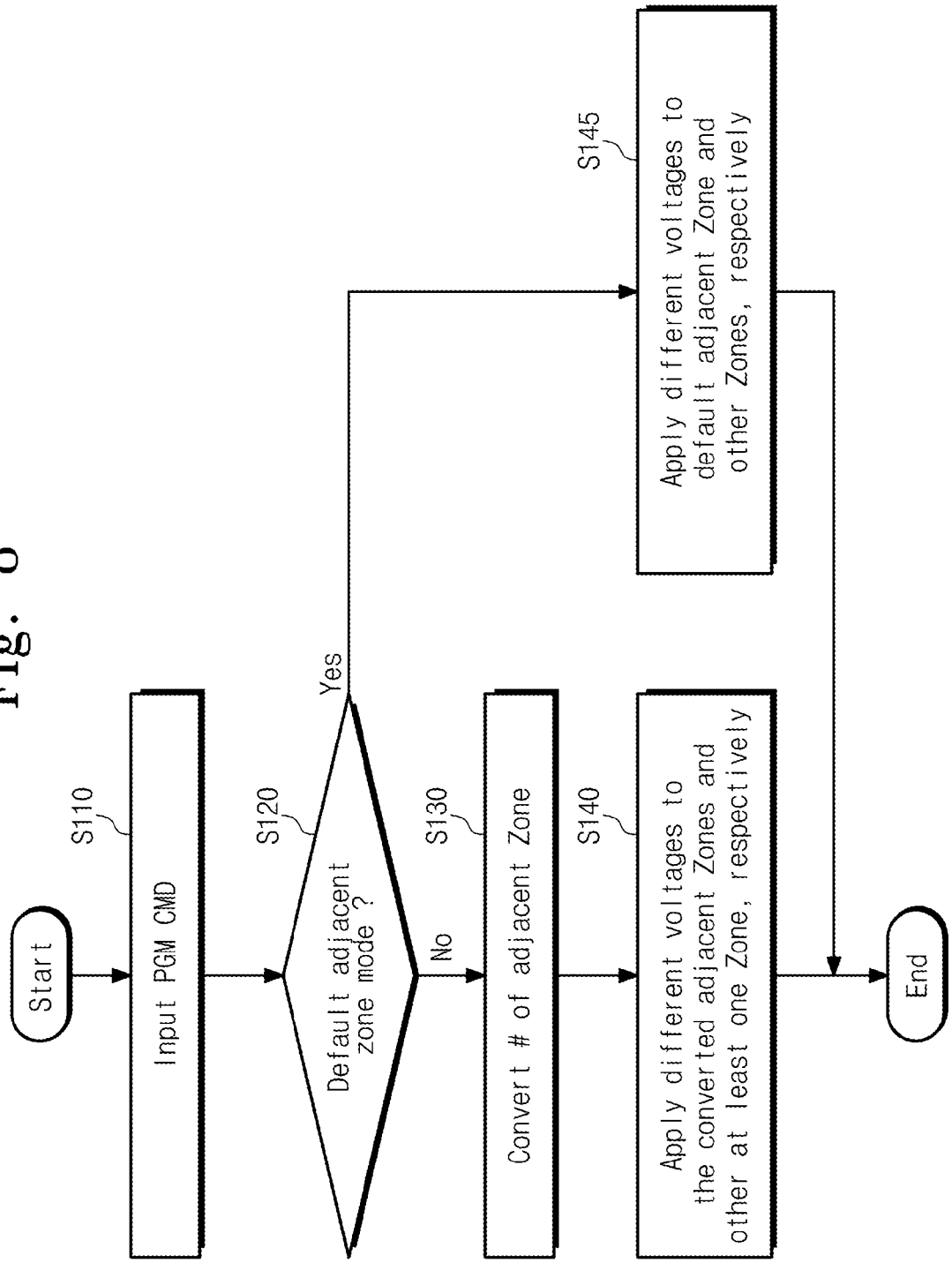
FIG. 8 is a flow chart schematically illustrating a driving method of a nonvolatile memory device 100 according to at least one example embodiment of inventive concepts.

FIG. 8 is a flow chart schematically illustrating a driving method of a nonvolatile memory device 100 according to at least one example embodiment of inventive concepts. Referring to FIGS. 1 to 6 and 8, in operation S110, a nonvolatile memory device 100 may receive a program command and an address. In operation S120, an adjacent zone controller 152 may determine whether an operation mode is a default adjacent zone mode, based on adjacent zone information AZI. In at least one exemplary embodiment, the input address may be used as the adjacent zone information AZI. As illustrated in FIG. 6, the adjacent zone information AZI may be information associated with a level of a program voltage Vpgm applied to a selected word line and/or a time. As illustrated in FIG. 7, the adjacent zone information AZI may be information associated with a level of a pass voltage Vpass applied to an unselected selected word line WLn−1 and/or a time. For convenience of explanation, it is assumed that the input address is used as the adjacent zone information AZI.

When the operation mode is not the default adjacent zone mode, the method proceeds to operation S130, in which the adjacent zone controller 152 changes (or determines) the number of adjacent zones according to the adjacent zone information AZI, that is, according to a location of a selected word line corresponding to the input address. Here, if the operation mode is not the default adjacent zone mode, then it may be desired to spread charges of an adjacent word line during a program operation.

After the number of adjacent zones is changed (or determined), in operation S140, a second zone voltage Vz2 may be applied to word lines of adjacent zones Zone1, Zone2, and Zone3 and a fourth zone voltage Vz4 may be applied to word lines of a zone Zone4, as illustrated in FIG. 5. Here, the second voltage Vz2 may be higher than the fourth zone voltage Vz4.

When the operation mode is the default adjacent zone mode, that is, when it is not desired to spread charges of an adjacent word line during a program operation, in operation S145, the second zone voltage Vz2 may be applied to word lines of a default adjacent zone and zone voltages Vz1, Vz3 and Vz4 may be applied to word lines of corresponding zones Zone1, Zone3, and Zone4, as illustrated in FIG. 4.

A program operation may be performed by applying a program voltage to a selected word line (e.g., WL9) after operation S140 or S145.

A driving method of a nonvolatile memory device 100 according to at least one example embodiment of inventive concepts may minimize pass voltage disturbance generated at zones during a program operation by adding adjacent zones based on adjacent zone information AZI.

Figure 9:
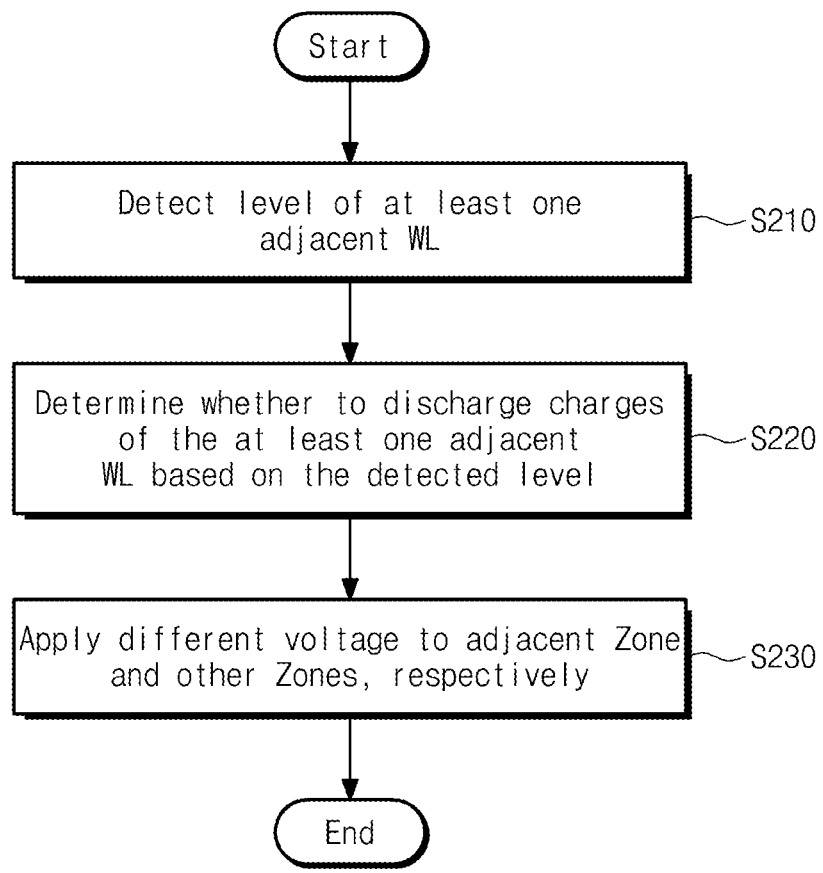
FIG. 9 is a flow chart schematically illustrating a driving method of a nonvolatile memory device 100 according to at least one example embodiment of inventive concepts.

FIG. 9 is a flow chart schematically illustrating a driving method of a nonvolatile memory device 100 according to at least one example embodiment of inventive concepts. For ease of description, it is assumed that a program operation is performed. Referring to FIGS. 1 to 5 and 7, in operation S210, a program command and an address may be received, a word line corresponding to the input address may be selected, and a level of at least one adjacent word line adjacent to the selected word line may be detected.

In operation S220, whether to discharge charges of the at least one adjacent word line may be determined based on the detected level of the adjacent word line. For example, as illustrated in FIG. 7, when a level of the adjacent word line is greater than or equal to a first target level TR1, a discharge enable signal DE may be activated, so that charges of the adjacent word line are discharged. On the other hand, as illustrated in FIG. 7, when a level of the adjacent word line is less than or equal to a second target level TR2, the discharge enable signal DE may be inactivated, so that charges of the adjacent word line are recharged.

In operation S230, different zone voltages may be applied to an adjacent zone and the remaining zones, and a program voltage may be applied to the selected word line.

The driving method of a nonvolatile memory device 100 according to at least one example embodiment of inventive concepts may minimize pass voltage disturbance generated at zones during a program operation by discharging charges of an adjacent word line based on a level of the adjacent word line.

Figure 10:
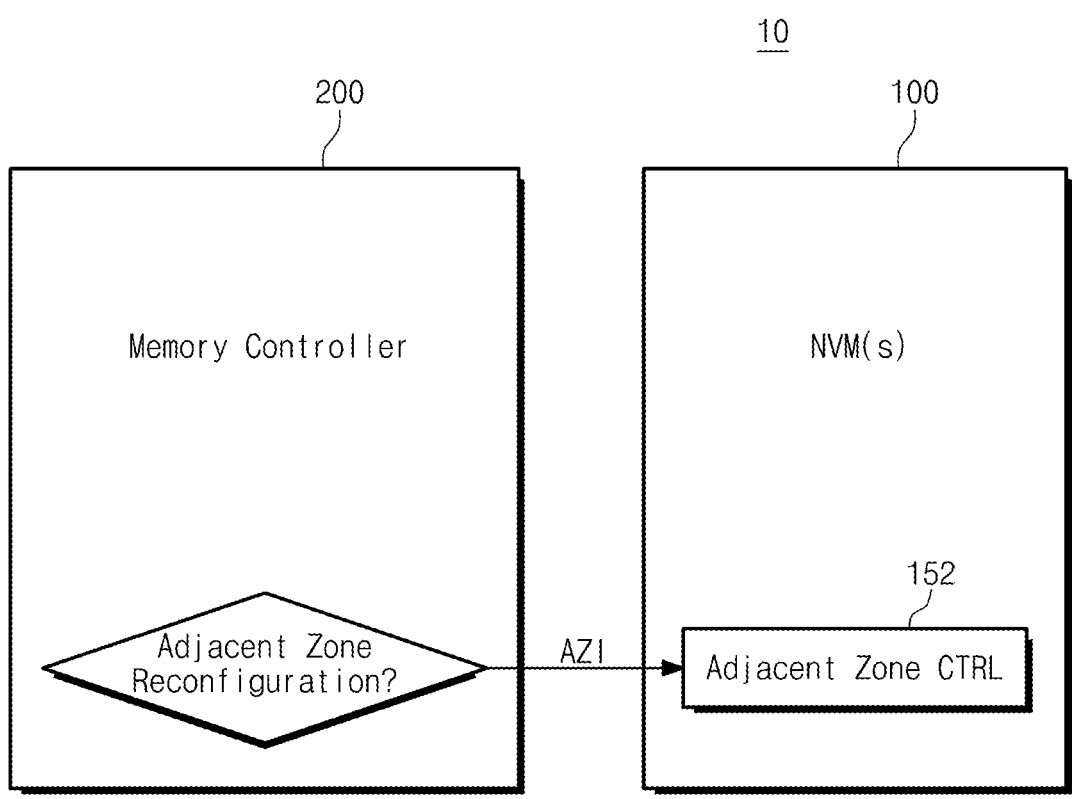
FIG. 10 is a block diagram schematically illustrating a memory system 10 according to at least one example embodiment of inventive concepts.

FIG. 10 is a block diagram schematically illustrating a memory system 10 according to at least one example embodiment of inventive concepts.

Referring to FIG. 10, a memory system 10 may include a nonvolatile memory device 100 and a memory controller 200 for controlling the nonvolatile memory device 100. The memory controller 200 may determine whether to change the number of adjacent zones during driving of the nonvolatile memory device 100 and provide new adjacent zone information AZI to the nonvolatile memory device 100 according to the determination result. An adjacent zone controller 152 of the nonvolatile memory device 100 may configure adjacent zones based on the new adjacent zone information AZI. Afterwards, an operation requested by the memory controller 200 may be performed. A default adjacent zone mode may be determined based on the adjacent zone information AZI.

In at least one exemplary embodiment, the memory controller 200 may determine whether to change the adjacent zone information AZI, based on information indicating a degree of deterioration of a memory block to be driven.

In at least one exemplary embodiment, the memory controller 200 may determine whether to change adjacent zone information AZI based on an external circumstance of the memory system 10. For example, the external circumstance of the memory system 10 may include a temperature of the memory system 10, a temperature of the nonvolatile memory device 100, a noise, a power state, etc.

The memory system 10 according to at least one example embodiment of inventive concepts may determine whether to change adjacent zone information AZI and change the adjacent zone information AZI according to the determination result. Thus, it is possible to drive the nonvolatile memory device 100 as desired (or alternatively, optimally).

The nonvolatile memory device 100 according to at least one example embodiment of inventive concepts may additionally have a discharge path formed at each zone to discharge charges of an adjacent word line. For example, the nonvolatile memory device 100 may be implemented such that a discharge path of an adjacent zone is activated when it is desired to discharge charges of the adjacent word line.

Inventive concepts are applicable to a solid state drive (SSD).

Figure 11:
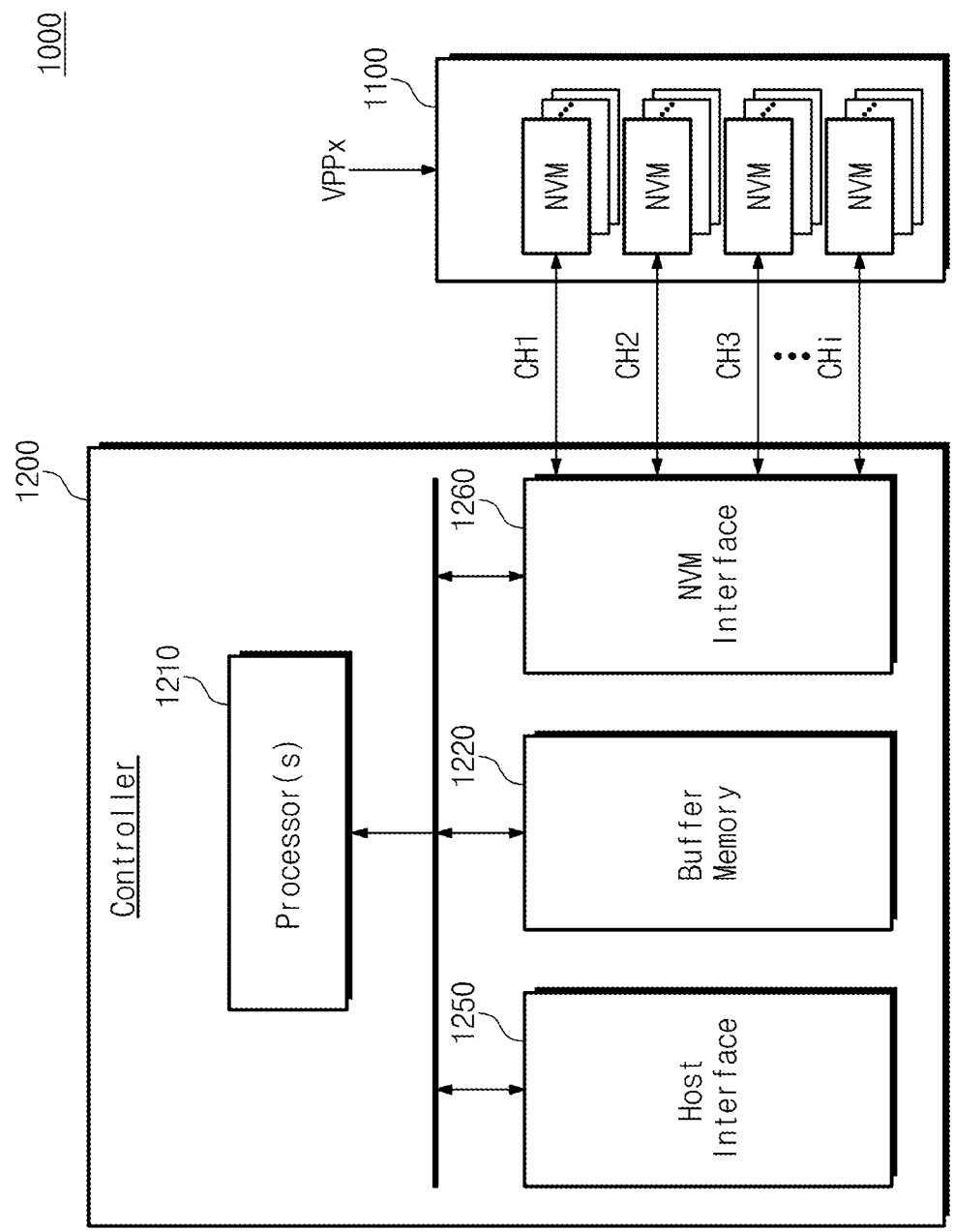
FIG. 11 is a block diagram schematically illustrating a solid state drive according to at least one example embodiment of inventive concepts.

FIG. 11 is a block diagram schematically illustrating a solid state drive according to at least one example embodiment of inventive concepts. Referring to FIG. 11, a solid state drive (hereinafter, referred to as SSD) 1000 may include a plurality of flash memory devices 1100 and an SSD controller 1200. The flash memory devices 1100 may be supplied with an external high voltage VPPx. Each of the flash memory devices 1100 may be implemented to change the number of adjacent zones or to discharge coupling charges as described with reference to FIGS. 1 to 10. The SSD controller 1200 may be connected to the flash memory devices 1100 through a plurality of channels CH1 to CHi (i being an integer of 2 or more). The SSD controller 1200 may include at least one processor 1210, a buffer memory 1220, a host interface 1250, and a flash interface 1260.

The SSD 1000 according to at least one example embodiment of inventive concepts may satisfy a desired (or alternatively, optimal) driving condition by changing the number of adjacent zones as desired.

Inventive concept are applicable to an embedded MMC (hereinafter, referred to as eMMC).

Figure 12:
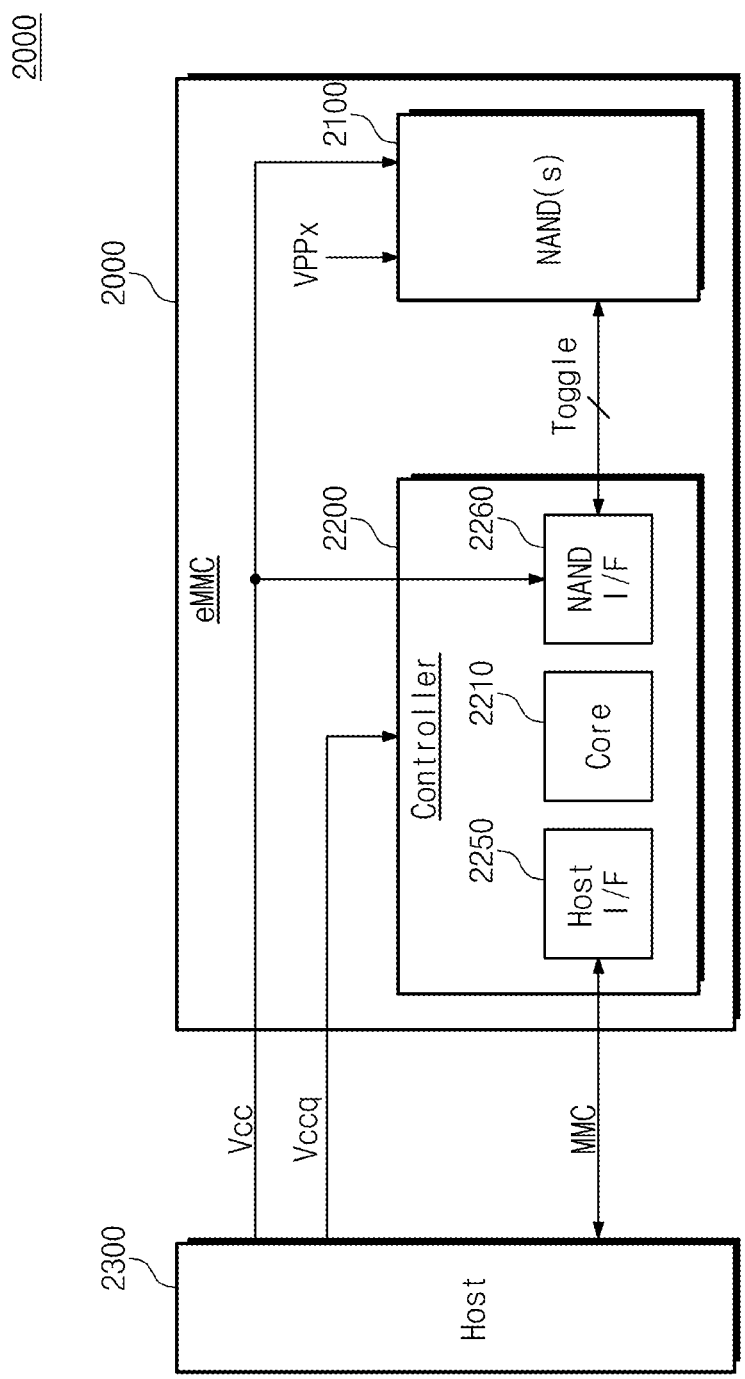
FIG. 12 is a block diagram schematically illustrating an eMMC according to at least one example embodiment of inventive concepts.

FIG. 12 is a block diagram schematically illustrating an eMMC according to at least one example embodiment of inventive concepts. Referring to FIG. 12, an eMMC 2000 may include at least one NAND flash memory device 2100 and controller 2200. The NAND flash memory device 2100 may be a single data rate (SDR) NAND flash memory device or a double data rate (DDR) NAND flash memory device. In at least one exemplary embodiment, the NAND flash memory device 2100 may include NAND flash memory chips. Herein, the NAND flash memory device 2100 may be implemented by stacking the NAND flash memory chips at one package (e.g., FBGA, Fine-pitch Ball Grid Array, etc.). Each of the NAND flash memory devices may be implemented to change the number of adjacent zones or to discharge coupling charges of an adjacent zone as described with reference to FIGS. 1 to 10.

The controller 2200 may be connected with the NAND flash memory device 2100 via a plurality of channels. The controller 2200 may include at least one controller core 2210, a host interface 2250, and a NAND interface 2260. The controller core 2210 may control an overall operation of the eMMC 2000. The host interface 2250 may be configured to perform an interface between the controller 2210 and a host. The NAND interface 2260 may be configured to provide an interface between the NAND flash memory device 2100 and the controller 2200. In at least one example embodiment, the host interface 2250 may be a parallel interface (e.g., an MMC interface). In at least one other example embodiment, the host interface 2250 of the eMMC 2000 may be a serial interface (e.g., UHS-II, UFS, etc.).

The eMMC 2000 may receive power supply voltages Vcc and Vccq from the host. Herein, the power supply voltage Vcc (e.g., about 3.3V) may be supplied to the NAND flash memory device 2100 and the NAND interface 2260, and the power supply voltage Vccq (e.g., about 1.8V/3.3V) may be supplied to the controller 2200.

The eMMC 2000 according to at least one example embodiment of inventive concepts is applicable to small-sized and low-power mobile products (e.g., Galaxy S series, Galaxy note series, iPhone, iPad, Nexus, etc.).

Inventive concept are applicable to universal flash storage UFS.

Figure 13:
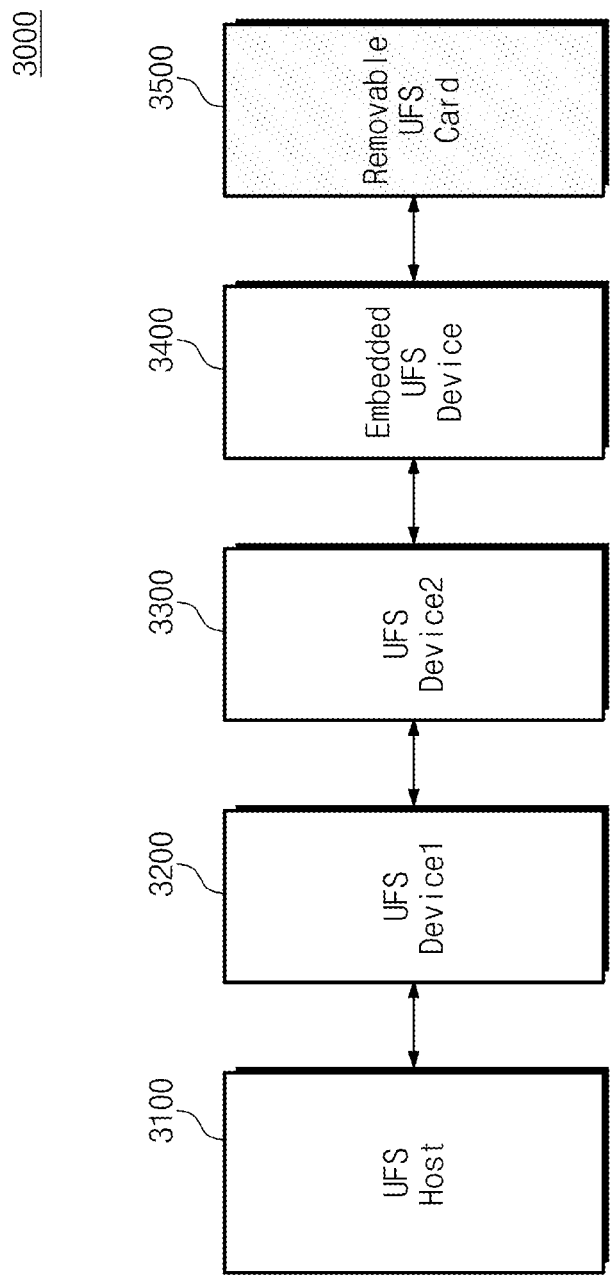
FIG. 13 is a block diagram schematically illustrating a UFS system 3000 according to at least one example embodiment of inventive concepts.

FIG. 13 is a block diagram schematically illustrating a UFS system 3000 according to at least one example embodiment of inventive concepts. Referring to FIG. 13, a UFS system 3000 may include a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may include a nonvolatile memory device 100 of FIG. 1.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

While inventive concepts have been described with reference to exemplary embodiments, it will be apparent to those skilled in the art that various changes and modifications may be made without departing from the spirit and scope of inventive concepts. Therefore, it should be understood that the above embodiments are not limiting, but illustrative.

What is claimed is:

1. A nonvolatile memory device, comprising:
a memory cell array including a plurality of memory blocks having a plurality of strings formed to penetrate word lines stacked on a substrate, the word lines having a plate shape;
a row decoder configured to,
select one of the memory blocks, and
drive a selected word line of the selected memory block with a selection voltage and a plurality of zones of the selected memory block with corresponding zone voltages, the plurality of zones including unselected word lines;
a voltage generating circuit configured to generate the selection voltage and the zone voltages;
an input/output circuit configured to temporarily store data to be written in the selected memory block during a program operation and to temporarily store data read from the selected memory block during a read operation; and
a control logic configured to control the row decoder, the voltage generating circuit, and the input/output circuit,
wherein the control logic is configured to determine a number of zones from among the plurality of zones based on information regarding the spread of charges to an unselected word line, and
wherein the determined number of zones includes at least one zone that has the selected word line.

2. The nonvolatile memory device of claim 1, wherein the voltage generating circuit comprises:
a selection voltage generator configured to generate the selection voltage; and
a plurality of zone voltage generators configured to generate the zone voltages.

3. The nonvolatile memory device of claim 2, wherein the determined number of zones comprises:
a default zone including the selected word line and having at least one unselected word line that is adjacent to the selected word line; and
an added zone that is adjacent to the default zone.

4. The nonvolatile memory device of claim 3, wherein the zone voltage generator corresponding to the added zone is configured to be turned on or off based on the information.

5. The nonvolatile memory device of claim 1, further comprising:
a discharge path configured to discharge charges of the unselected word lines.

6. A vertical nonvolatile memory device, comprising:
a memory cell array including a plurality of memory blocks, each of the memory blocks being divided into a plurality of zones including first and second zones, each of the zones being a grouping of adjacent word lines, the second zone being adjacent to the first zone;
a voltage generator configured to generate a selection voltage, a first zone voltage, and a second zone voltage; and
a control logic configured to control a row decoder to apply, during a program operation, the selection voltage to a selected word line in the first zone,
the first zone voltage to unselected word lines in the first zone, and
the second zone voltage to unselected word lines in the second zone.

7. The vertical nonvolatile memory device of claim 6, wherein the first zone voltage is greater than the second zone voltage.

8. The vertical nonvolatile memory device of claim 6, wherein the plurality of zones includes a third zone that is adjacent to the second zone, the voltage generator is configured to generate a third zone voltage, and the control logic is configured to control the row decoder to apply the third zone voltage to the third zone during the program operation.

9. The vertical nonvolatile memory device of claim 8, wherein the first, second, and third zone voltages are substantially the same.

10. The vertical nonvolatile memory device of claim 6, wherein the control logic is configured to control an application timing of the first and second zone voltages based on a voltage level of an unselected word line adjacent to the selected word line.

* * * * *